(12) United States Patent
Pla et al.

(10) Patent No.: US 11,894,812 B2
(45) Date of Patent: Feb. 6, 2024

(54) KINETIC INDUCTANCE PARAMETRIC AMPLIFIER

(71) Applicant: Silicon Quantum Computing Pty Limited, Kensington (AU)

(72) Inventors: Jarryd Pla, New South Wales (AU); Mykhailo Savytskyi, New South Wales (AU)

(73) Assignee: SILICON QUANTUM COMPUTING PTY LIMITED, Kensington (AU)

( * ) Notice: Subject to any disclaimer, the term of this patent is extended or adjusted under 35 U.S.C. 154(b) by 0 days.

(21) Appl. No.: 17/641,566

(22) PCT Filed: Sep. 9, 2020

(86) PCT No.: PCT/AU2020/050957
§ 371 (c)(1),
(2) Date: Mar. 9, 2022

(87) PCT Pub. No.: WO2021/046603
PCT Pub. Date: Mar. 18, 2021

(65) Prior Publication Data
US 2022/0321073 A1   Oct. 6, 2022

(30) Foreign Application Priority Data

Sep. 9, 2019   (AU) ................................ 2019903318

(51) Int. Cl.
*H03F 19/00*   (2006.01)
*H03F 7/02*    (2006.01)

(52) U.S. Cl.
CPC ................................... *H03F 19/00* (2013.01)

(58) Field of Classification Search
CPC .............. H03F 19/00; H03F 2200/276; H03F 2200/429; H03F 7/02; G02F 1/392; H01P 1/2013
(Continued)

(56) References Cited

U.S. PATENT DOCUMENTS 8,878,626 B2 * 11/2014 Zmuidzinas ............. H03F 7/02
                                                        333/99 S
2012/0098594 A1  4/2012 Zmuidzinas et al.
(Continued)

OTHER PUBLICATIONS

Kher, A. S., "Superconducting Nonlinear Kinetic Inductance Devices", California Institute of Technology, 2017, doi: 10.7907 /Z9JQOZ1F, pp. i-162. See the whole document in particular the title; abstract; figs 2.6, 2.15, 3.1, 3.3, 3.4, 3.7, 3.9, 3.11; and pp. 38, 61-62, 70-80, 90.
(Continued)

*Primary Examiner* — Hieu P Nguyen
(74) *Attorney, Agent, or Firm* — Lee & Hayes P.C.; Bea Koempel-Thomas

(57) ABSTRACT

The present disclosure relates to a kinetic inductance parametric amplifier that comprises an input port arranged to receive a pump tone, a DC bias and input signal; an output port arranged to provide an amplified version of the input signal; a tunable stepped-impedance assembly arranged to attenuate and/or filter predetermined frequency bands; and a high kinetic inductance line. The tunable stepped-impedance assembly is tuned at a frequency that allows for the amplifier to resonate at a predetermined frequency and a pump tone with a frequency higher than the input signal and a DC biasing signal to be transmitted to the high kinetic inductance line.

18 Claims, 8 Drawing Sheets

(58) Field of Classification Search
USPC .................................................. 330/4, 4.6
See application file for complete search history.

(56) References Cited

U.S. PATENT DOCUMENTS

| | | |
|---|---|---|
| 2019/0074801 A1 | 3/2019 | Tan |
| 2022/0140927 A1* | 5/2022 | Bronn .................. G06N 10/00 370/480 |

OTHER PUBLICATIONS

PCT Search Report for corresponding PCT Application No. PCT/US2020/050957 dated Oct. 19, 2020, 4 pages.
PCT Written Opinion for corresponding PCT Application No. PCT/AU2020/050957 dated Oct. 19, 2020, 4 pages.
Vissers M. R. et al.,"Low-noise Kinetic Inductance Traveling-wave Amplifier Using Three-wave Mixing", Appl Phys Lett. 108, 2016, doi:10.1063/1.4937922, pp. 1-13. See the whole document in particular the tittle; abstract; figs 1-5; and pp. 2-5.

* cited by examiner

KINETIC INDUCTANCE PARAMETRIC AMPLIFIER

This Application is a U.S. National Stage application of PCT/AU2020/050957 filed Sep. 9, 2020, which claims priority to AU application 2019903318, filed Sep. 9, 2019, which is incorporated herein by reference.

TECHNICAL FIELD

The present technology relates to a parametric amplifier based on a superconducting material. In particular, the present technology relates to a Kinetic Inductance Parametric Amplifier.

BACKGROUND

Parametric amplification is a widely used technique in microwave engineering and optics. It provides gain by variation of a circuit parameter, such as capacitance or inductance. In particular, it relies on a non-linear reactive element (capacitor or inductor for microwaves, non-linear refraction in optics) to mix two AC signals.

Power can be transferred from one mode (the "pump") to another (the "signal"), resulting in amplification of the signal. An advantage of this type of amplification is that in purely reactive elements there is no dissipation, which means minimal added noise.

Parametric amplifiers using reversed-bias semiconductor diodes, for example, have been shown to be capable of very low noise performance in the microwave region. However, even in this type of amplifier, the thermal noise generated in the semiconductor spreading resistance is unavoidable.

There are numerous applications, for example amplifying small signals (e.g., single photons) such as those that arise during the readout of qubits in quantum processors, that require parametric amplifiers which provide low noise performance in the quantum processor operating conditions and are compatible with the quantum processor architecture.

Parametric amplification by Josephson junction devices is used in quantum computing architectures based on Josephson junction superconductive qubits. Josephson junctions behave like highly non-linear inductors.

To increase the amplification bandwidth, Josephson junctions can be incorporated into broadband transmission lines, a class of devices referred to as (Josephson) Travelling Wave Parametric Amplifiers (TWPAs). Since mixing and amplification occurs over many wavelengths in a TWPA, dispersion engineering must be performed to maintain phase-matching between the pump and signal. Furthermore, parametric amplifiers based on Josephson junctions are extremely sensitive to magnetic fields and unsuitable for applications where magnetic fields are required.

An alternative approach to parametric amplification using superconducting circuits is to exploit the inertia of cooper pairs, which provides an effective "kinetic inductance" that is dependent on the current passing through the superconductor. Kinetic inductance is an inherent property of superconductors and can be large enough to facilitate parametric amplification in materials with a large normal state resistivity, such as NbN, TiN and NbTiN. Kinetic Inductance TWPAs have attracted much interest recently due to their ease of fabrication (they do not contain any Josephson junctions) and high dynamic range (resulting from the high critical currents supported). The quadratic nonlinearity of the kinetic inductance supports a four-wave mixing process, where two pump photons combine to create a signal photon and an idler photon.

Recently, it has been shown that biasing the Kinetic Inductance TWPAs with a DC current produces three-wave mixing and lower pump power requirements. Three-wave mixing is advantageous as it involves a single pump photon at approximately twice the signal frequency, making it easy to filter out the in the measurement chain.

So far, three-wave mixing in kinetic inductance parametric amplifiers has only been achieved using travelling-wave geometries, since the devices must combine currents over a wide frequency range, covering DC, the signal at frequency $f_s$ and the pump at approximately $2f_s$. Kinetic inductance TWPAs are long, ranging from 20 cm-2 m, which poses challenges for fabrication an integration in microelectronic circuits.

SUMMARY

In accordance with the first aspect, the present invention provides, a kinetic inductance parametric amplifier comprising: an input port arranged to receive a pump tone, a DC bias and input signal; an output port arranged to provide an amplified version of the input signal; a stepped-impedance assembly arranged to attenuate and/or filter predetermined frequency bands; and a high kinetic inductance line; wherein the tunable stepped-impedance assembly is tuned at a frequency that allows for the amplifier to resonate at a predetermined frequency and a pump tone with a frequency higher than the input signal and a DC biasing signal to be transmitted to the high kinetic inductance line.

In an embodiment, the tunable stepped-impedance assembly comprises a co-planar waveguide (CPW) microwave bandstop filter.

In an embodiment, the high kinetic inductance line is shorted to ground. In an alternate embodiment, the high kinetic inductance line forms a quarter wavelength resonator (or harmonic of).

In an embodiment, the high kinetic inductance line resonates at a frequency in a stopband of the tunable stepped-impedance assembly.

In an embodiment, the frequency response of the tunable stepped-impedance has a continuous central line that allows for a DC current to pass through and provide three-wave mixing.

In an embodiment, the high kinetic inductance line comprises NbTiN.

In an embodiment, the high kinetic inductance line comprises a single layer of NbTiN.

In an embodiment, the stepped-impedance is tunable.

In accordance with the second aspect, the present invention provides a method for performing parametric amplification with a kinetic inductance parametric amplifier, the method comprising the step of: providing a kinetic inductance parametric amplifier in accordance with any one of the preceding claims; applying a DC signal configured to modify the kinetic inductance and one or more filtering properties of the stepped-impedance assembly; applying a pump tone and an input signal to an input port; detecting an amplified version of the input signal at the output port.

In an embodiment, the one or more filtering properties of the tunable stepped-impedance assembly comprise the bandstop frequency and attenuation value and/or quality factor.

In an embodiment, the kinetic inductance parametric amplifier is a two-port device with a large port coupling asymmetry (i.e., with port coupling rates that differ by more than an order of magnitude).

In an embodiment, the high kinetic inductance line is between two asymmetrically coupled ports.

BRIEF DESCRIPTION OF THE DRAWINGS

Notwithstanding any other forms which may fall within the scope of the present invention, to make the technology more clearly understood, an embodiment of the technology will now be described, by way of example only, with reference to the accompanying drawings in which.

DETAILED DESCRIPTION OF EMBODIMENTS

When two waves pass through a non-linear medium, the amplitude of one wave periodically varies a parameter (relating to the nonlinearity) governing propagation of the other, resulting in power transfer between them. The frequency of the first wave (the pump) should be twice the frequency or approximately the same frequency as the second wave (the signal), depending on the order of the nonlinearity. For this amplification to add only the noise required by quantum mechanics (said to be quantum-limited), the non-linear element and other amplifier components should not dissipate energy.

When superconducting materials are cooled to a temperature below their critical temperature, they enter the superconducting phase, where currents can pass through them with almost no dissipation.

Superconducting circuits that leverage kinetic inductance can be used for parametric amplification using materials such as NbN, TiN and NbTiN. Kinetic Inductance Travelling Wave Parametric Amplifiers have been investigated in the recent years due to their ease of fabrication (they do not contain any Josephson junctions) and high dynamic range (resulting from the high critical currents supported). The quadratic non-linearity of the kinetic inductance supports a four-wave mixing process, where two pump photons combine to create a signal photon and an idler photon.

Embodiments of the present invention provide a kinetic inductance parametric amplifier (KIPA) implemented with a resonant structure. The device is based on a microwave transmission line geometry that forms a resonator and simultaneously allows for both DC and high frequencies to pass in the structure.

Figure 1A:
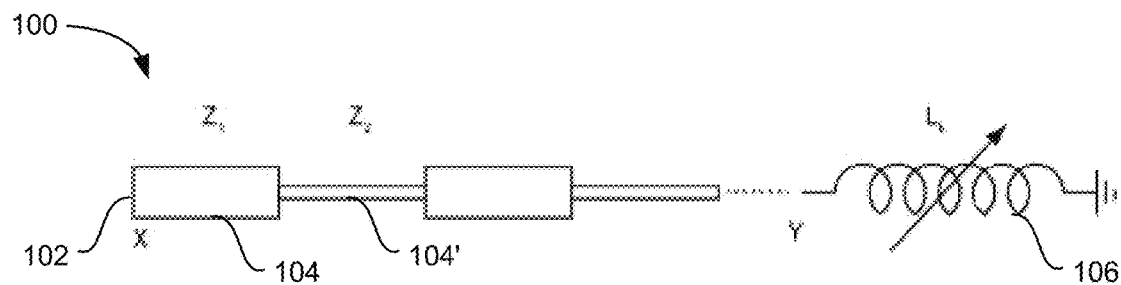
FIG. 1: shows a schematic circuit representation of the amplifier (a); an embodiment of the amplifier realised using a co-planar waveguide (b); and sample transmission S-parameter of the stepped impedance filter/Bragg mirror (c).

FIG. 1(a) shows a schematic circuit representation of the amplifier 100. The design has a single port 102 that works as an input port for the pump tone, the signal and the DC signal. The same port 102 is also used as an output port. The amplifier 100 further includes a stepped-impedance coplanar waveguide (CPW) microwave bandstop filter 104, 104', shorted to ground through a length of high kinetic inductance line 106. The high kinetic inductance section 106 is decoupled from the input/output port 102 by the bandstop filter 104, 104' and resonates at a frequency that depends on several factors (e.g., geometry, the amount of kinetic inductance, etc.). The bandstop filter is formed by varying the impedance of the CPW between two or more values, and its parameters (attenuation, bandwidth) can be tuned by varying the impedances, section lengths and number of repetitions of the stepped impedance. This configuration can also be viewed as a Bragg cavity in optics, where microwaves are confined in the high kinetic inductance line (cavity) by a Bragg mirror (the stepped-impedance CPW).

Figure 1B:
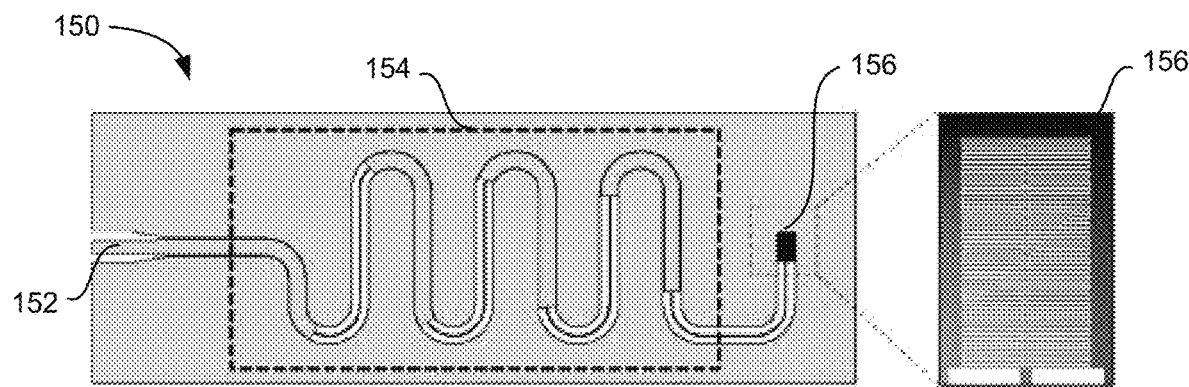

FIG. 1(b) shows an embodiment of the amplifier realised using a CPW 150. The input port 152 is directly connected to the waveguide, which includes a distributed impedance arrangement 154. The co-planar waveguide feeds a high kinetic inductance section 156.

Figure 1C:
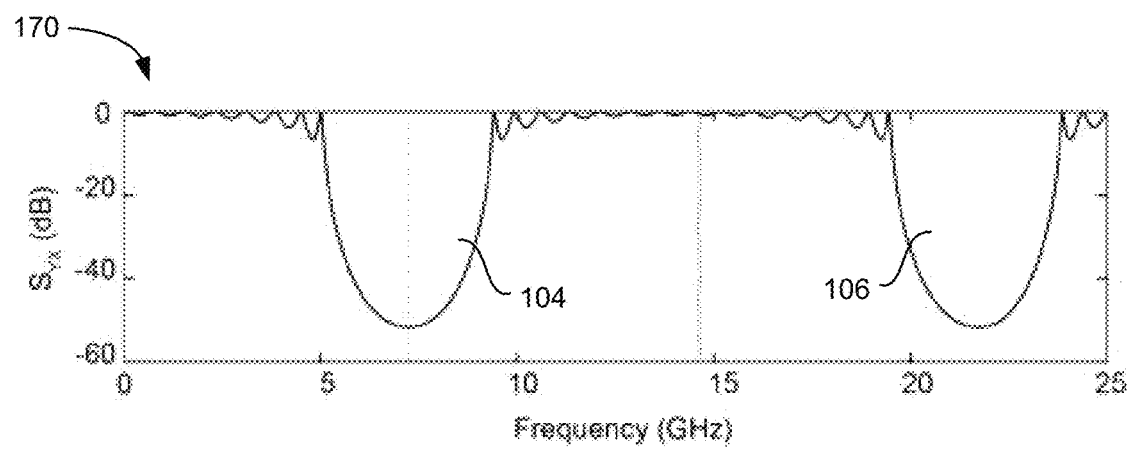

FIG. 1(c) shows a microwave transmission simulation through a sample stepped-impedance filter like the impedance filter/Bragg mirror 104,104'. In embodiments, the length of the cavity is chosen to produce a resonance somewhere in the first stopband, for example at the location of the dashed line. Since the CPW has a continuous central line it passes a DC current for producing three-wave mixing. In addition, the filter passes a pump signal at double frequency (dotted line in FIG. 1(c)).

The external coupling rate of the high kinetic inductance section 156 to the feedline 152 sets the bandwidth of the resonator and therefore the bandwidth of the amplifier. The external coupling rate can be controlled through the design of the bandstop filter 154. In general, lowering the attenuation of the bandstop filter will increase the bandwidth of the amplifier.

In another embodiment, the ground connection of the high kinetic inductance section 156 can be replaced with a second Bragg mirror and port with a lower coupling rate than the first port 152,154. In this embodiment, the coupling rate of the second port is lower than the coupling rate of the first port by more than an order of magnitude. The coupling rate can be reduced, for example, by increasing the number of repetitions of the stepped impedance structure in the bandstop filter/Bragg mirror. The input signal is applied to either port 1 or port 2 and because of the asymmetric coupling rates, will preferentially leave the device through the more strongly coupled port 1. The pump tone can be applied through either port 1 or port 2.

Figure 2:
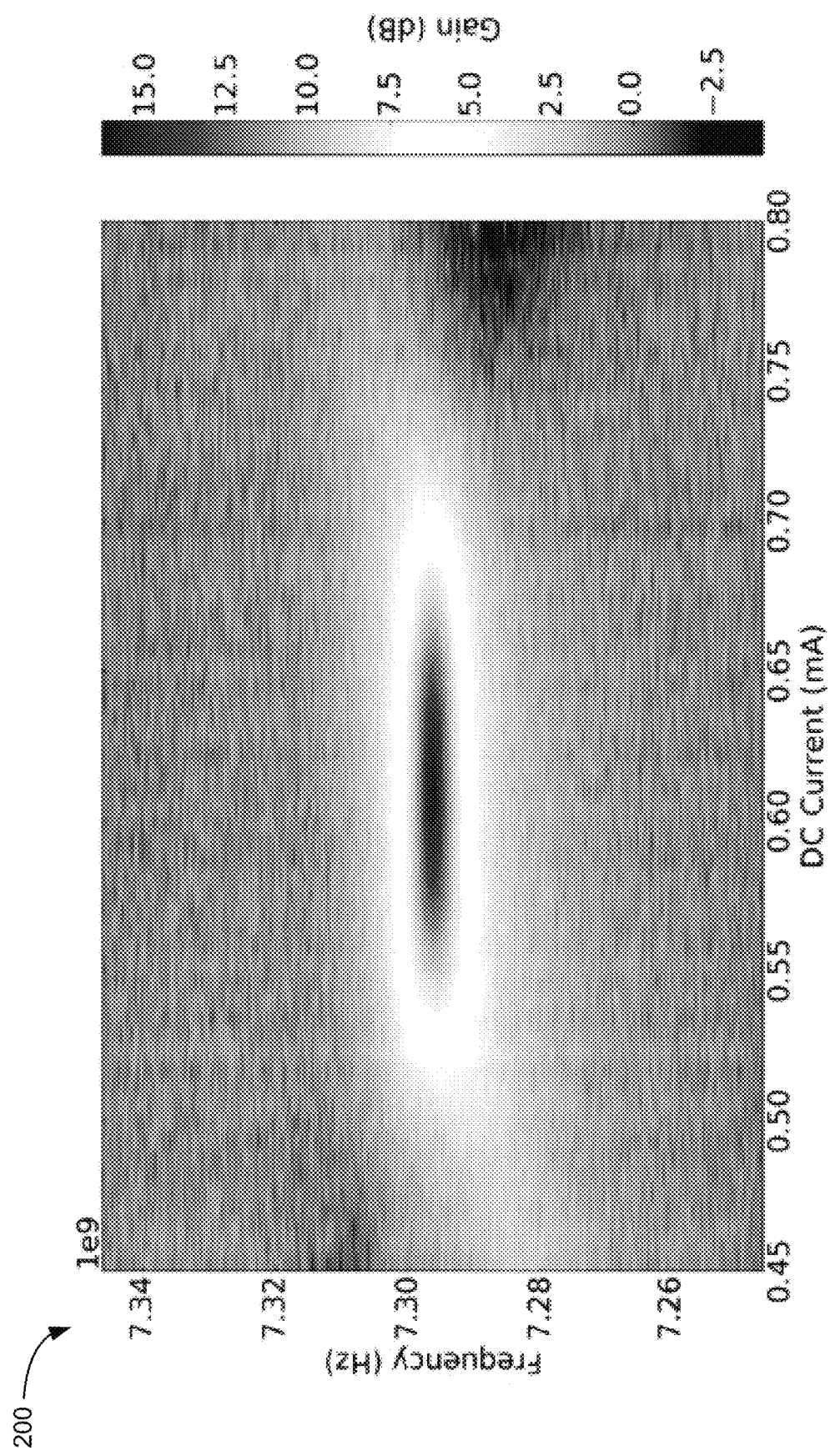
FIG. 2 shows measurement results of signal gain reflected from a kinetic inductance parametric amplifier.

FIG. 2 shows the gain measured for a microwave signal reflected from a single-port NbTiN KIPA in the presence of a pump signal and DC current. A pump tone at approximately twice the signal frequency is applied in addition to a DC current (which is varied in this experiment). The measurement was taken at a temperature of 400 mK and in a parallel magnetic field of 200 mT, which is possible due to the high critical field of NbTiN and lack of Josephson junctions.

Figure 3:
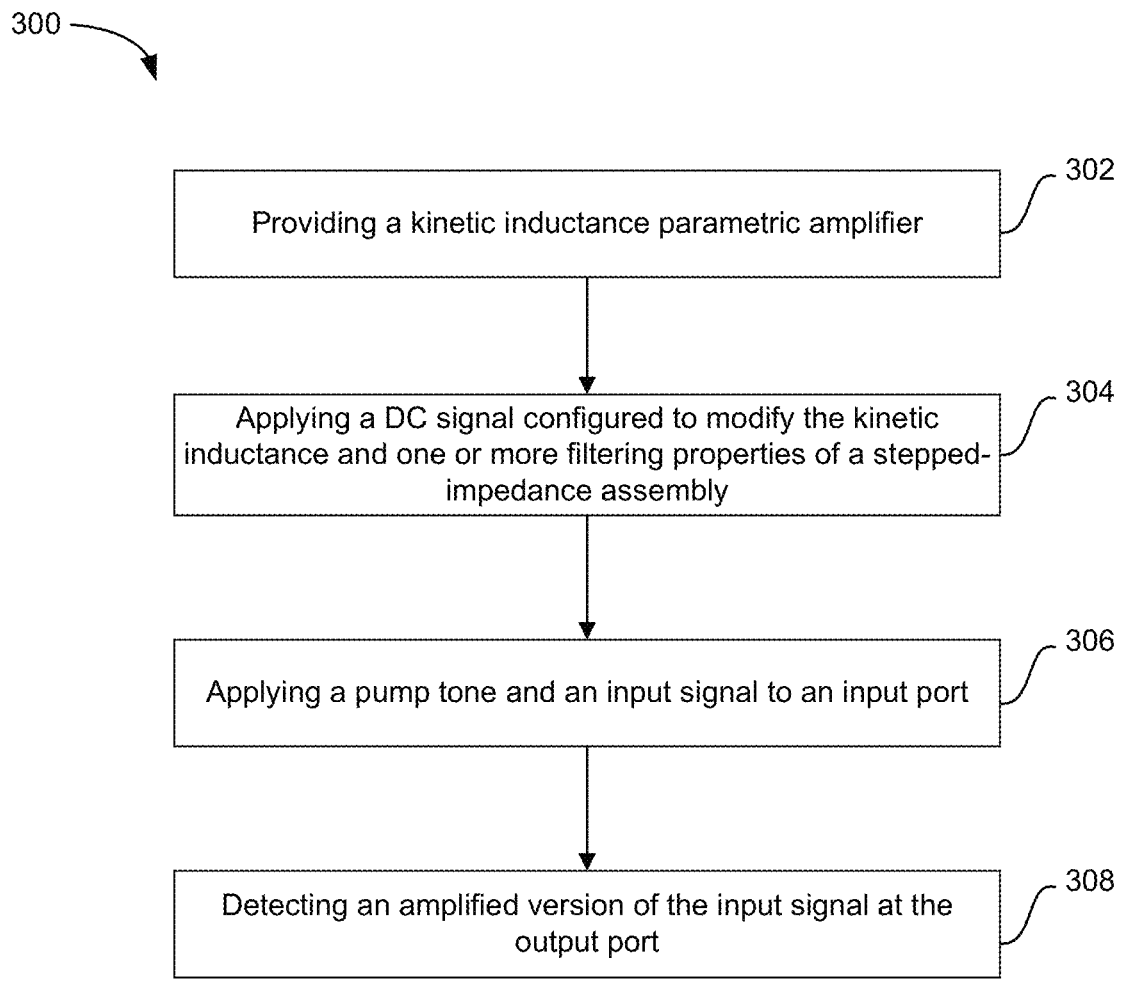
FIG. 3 is a flow diagram outlining steps to perform amplification using the amplifier shown in FIG. 1.

FIG. 3 illustrates an example process for utilizing the amplifier 100. In particular, the process begins at step 302, where a kinetic inductance parametric amplifier as described above is provided.

At step 304, a DC signal is applied to an input port 102 of the amplifier 100. The DC signal is configured to modify the kinetic inductance and one or more filtering properties of the stepped-impedance assembly.

At step 306, a pump tone and an input signal are applied to the input port 102. The pump tone may have a frequency that is double that of the input signal.

Finally, at step 308, an amplified version of the input signal is detected at the output port (which is the same as the input port 102).

Embodiments of the present disclosure can be used to amplify small signals (e.g. single photons), such as those that arise during the readout of qubits in quantum processors. In embodiments, the device is made from a single layer of NbTiN and a single-exposure lithography fabrication process, therefore it can be produced cost effectively and at scale. In addition, as it is a resonant amplifier, it is considerably shorter (<2 cm) than other NbTiN kinetic inductance amplifiers, providing an improved yield. Since there are no Josephson junctions in the device, it can be operated in large magnetic fields and high temperatures, opening further applications. In embodiments, the large critical current of the films provides a high dynamic range, with a 1 dB compression point exceeding—60 dBm.

The amplifying element of the device is effectively a microwave resonator, which can be used to perform electron spin resonance (ESR) spectroscopy of small samples at cryogenic temperatures. The signal-to-noise ratio (SNR) is one of the most important parameters in a spin resonance experiment, as it has a strong impact on measurement time. Loss between the input signal and first amplifier in the measurement chain degrades the SNR. As the KIPA described herein is operable in magnetic fields and can be quantum-noise-limited, it provides an integrated ESR resonator/amplifier solution (with no additional loss between ESR resonator and amplifier) that can be advantageously used to perform high-sensitivity ESR spectroscopy.

In some configurations, the resonator can also be used to relax the spins through something called the Purcell effect. This allows fast measurement repetition times, which otherwise would be very slow (due to long spin relaxation time at these temperatures and magnetic fields).

The DC current used to facilitate three-wave mixing also allows for fast control of the resonator frequency.

In addition, in embodiments, the DC current can also be used to change the quality factor of the resonator. This is done by altering the impedance of the bandstop filter sections and/or the relative position of the resonator frequency with the bandstop region. Advantageously, this capability allows to reach a regime called critical coupling (where the quality factor matches the losses) where the device is most sensitive at detecting spin resonance.

Phase-Sensitive Amplification and Squeezing

The amplifier 100 described here behaves as a near-ideal degenerate three-wave mixing device, allowing phase-sensitive amplification and squeezing. By selecting a pump frequency precisely twice that of the input signal frequency, $\omega_p = 2\omega_s$, the output signal reflected from the amplifier 100 can be amplified or de-amplified depending on the phase relationship between the pump and the input signal.

The phase-sensitive power gain $G(\Delta\varphi)$ depends on the signal power gain $G_s$ and the relative pump/signal phase $\Delta\varphi$ as $$G(\Delta\varphi) = 2G_s - 1 + 2\sqrt{G_s(G_s-1)} \cos(2\Delta\varphi)$$

When $\Delta\varphi = 0, \pm\pi$, the input signal is amplified, however, if $\Delta\varphi = \pm\pi/2$ the input signal is de-amplified.

Figure 4:
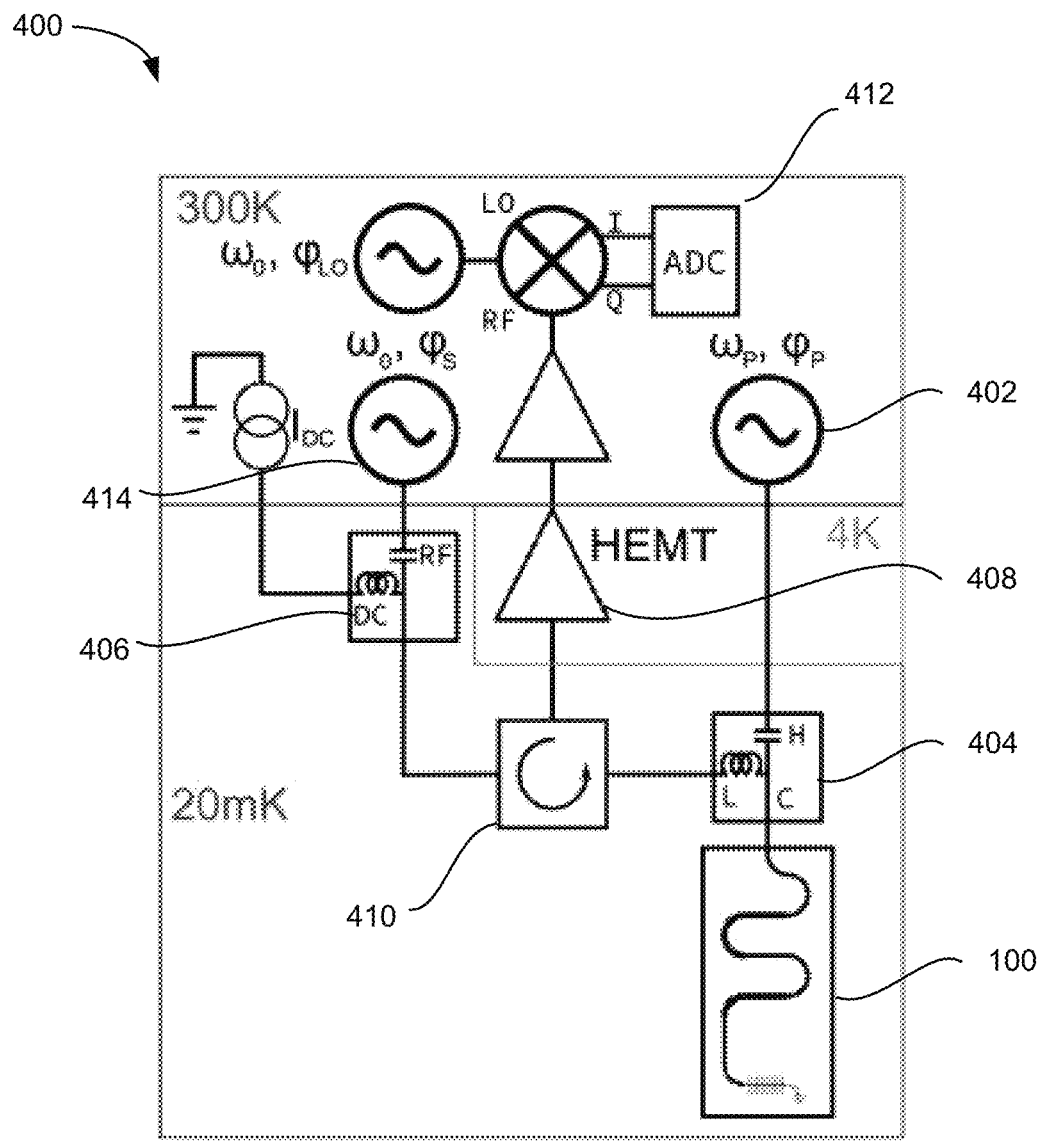
FIG. 4 shows a simplified setup for cooling the KIPA below its superconducting critical temperature and operating it as an amplifier.

In the limit of large signal gain $G(0) \approx 4G_s$ and $G(\pi/2) \approx \frac{1}{4}G_s$. The amplifier 100 can be operated as a phase-sensitive amplifier using the example setup shown in FIG. 4. In particular, as shown in FIG. 4, the amplifier 100 is installed on the mixing chamber plate of a dilution refrigerator to achieve quantum-limited noise performance. For applications where a quantum-limited system noise is not needed the amplifier can also be installed and operated at higher temperatures if required (e.g. at 4 K). The pump signal generator 402 is connected to the amplifier 100 via a diplexer 404, whereas the DC bias current is connected to the signal path via a bias tee 406. Further, the output port is connected to one or more amplification stages 408 via a circulator 410. The amplification stages are connected to a measurement setup 412. It will be appreciated that this simplified setup 400 is merely exemplary. Other measurement setups can be used as well.

In use, an input microwave signal (frequency $\omega_s$, phase $\varphi_s$) and a pump tone (frequency $\omega_p$) can be applied to the amplifier 100 via the pump signal generator 402 and an input signal generator 414 with a swept phase $\varphi_p$. The output power is monitored and measured by the measurement setup 412.

Figure 5A:
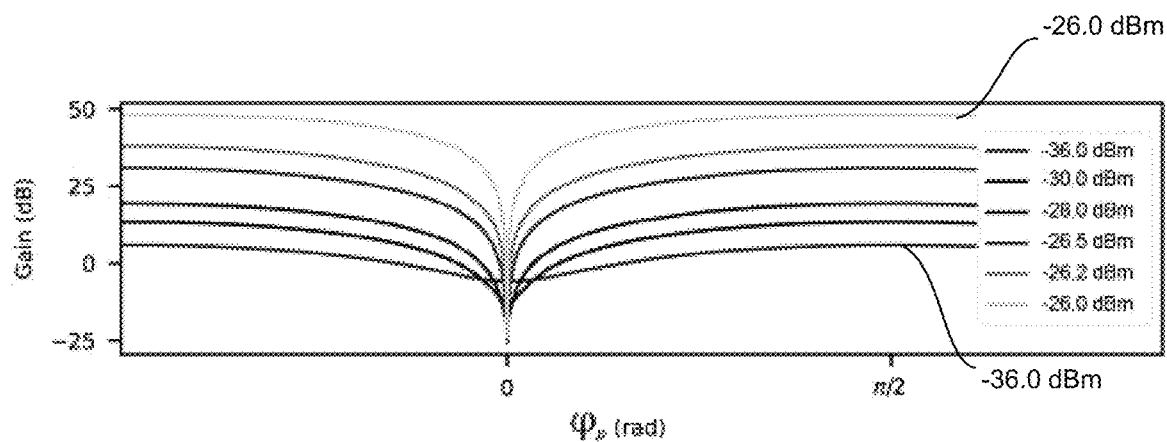
FIG. 5a shows a phase-sensitive gain curve of the amplifier.

The resulting phase-sensitive gain curves measured are shown in FIG. 5a. In particular, this chart shows the phase dependence of the amplifier 100 gain operated in degenerate mode. The pump phase $\varphi_p$ is stepped relative to the fixed input signal phase $\varphi_s$. At $\varphi_p = 0$ the signal is de-amplified, whilst at $\varphi_p = \pm\pi/2$, the amplifier 100 experiences maximum gain. The various traces are taken with different pump powers (from −36 dBm to −26 dBm at the input of the KIPA), corresponding to different maximum gains. As seen in this figure, the gain is the highest (approximately 50 dB) when the pump power is −26 dBm and about 10 dB when the input power is −30 dBm.

Figure 5B:
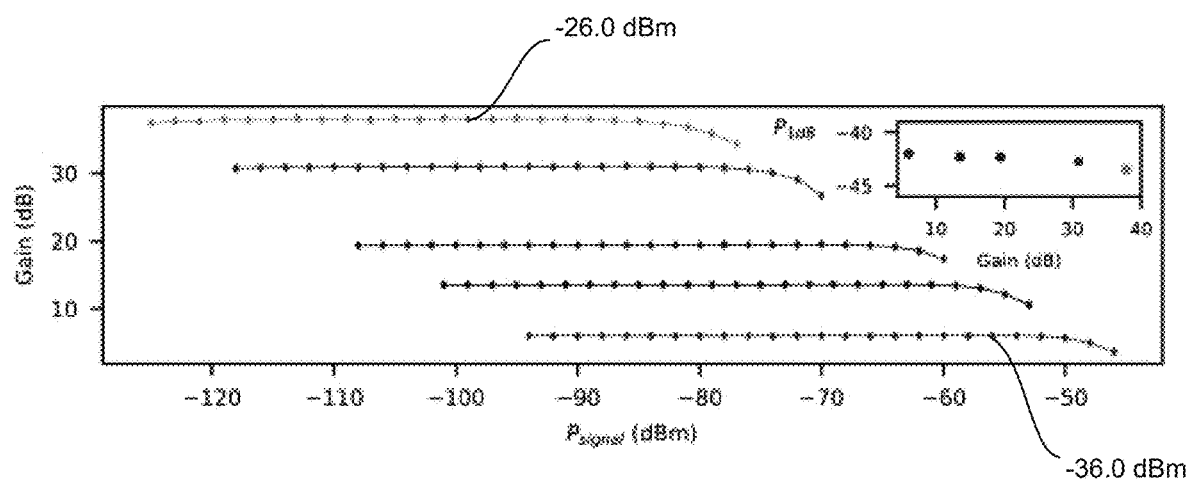
FIG. 5b shows the output power 1 dB gain compression point of the amplifier.

FIG. 5b shows the maximum gain of each trace in FIG. 5a as a function of the input signal power. The inset 502 depicts the output power at which the maximum gain drops by 1 dB (the 1 dB compression point).

In addition to achieving exceptionally large gains (up to 50 dB), the 1 dB compression point output power was found to be greater than −45 dBm (FIG. 5b). This is approximately 5-6 orders of magnitude higher than the 1 dB compression point for a typical JPA-based parametric amplifier.

Figure 6A:
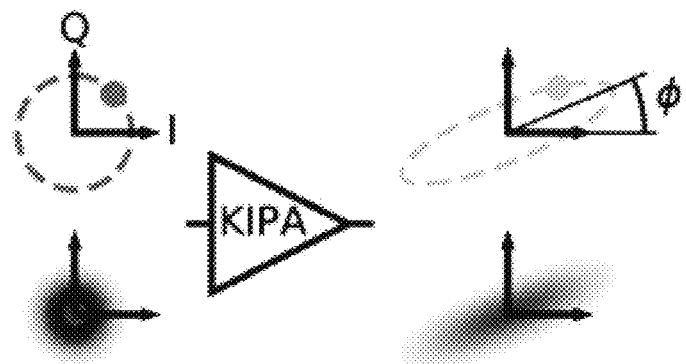
FIG. 6a is a schematic that depicts the amplification and de-amplification of a phase-swept coherent state as well as squeezing of vacuum noise.
Figure 6B:
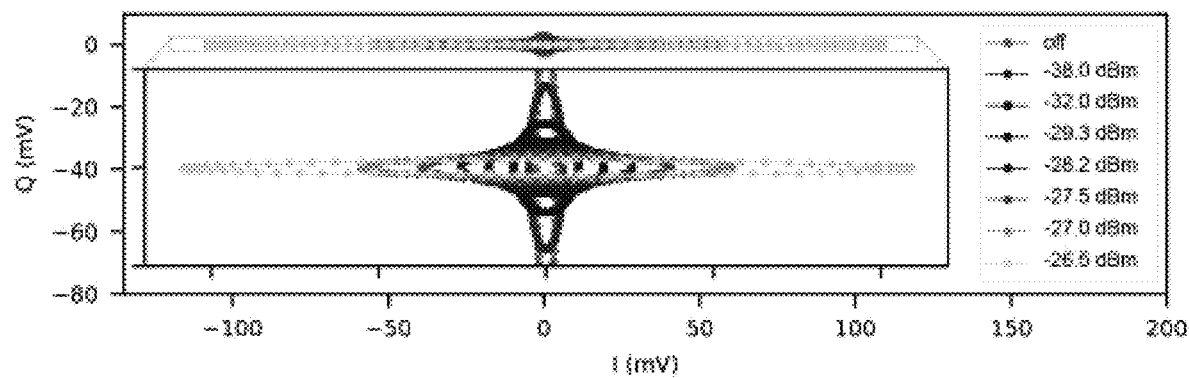
FIG. 6b is a measurement result showing the amplification and de-amplification of a phase-swept coherent state, for different pump powers.

In FIG. 6 the output field quadratures of an amplified microwave signal applied to the amplifier input are plotted, measured with homodyne detection. In particular, FIG. 6a depicts the amplification and de-amplification of a phase-swept signal as well as squeezing of vacuum noise. FIG. 6b illustrates the signal phase swept with constant signal amplitude to trace a circle on the IQ plane. As the pump signal is introduced, the circle is stretched into an ellipse, showing the squeezing capabilities of the amplifier 100.

A local oscillator phase ($\varphi_{LO}$) is selected to align the amplified field quadrature with the I axis and the de-amplified quadrature along the Q axis of the output IQ-plane. As the pump power is increased, the microwave tone (or so-called coherent state)—which traces a circle on the IQ plane when the amplifier 100 is turned off—becomes stretched into an ellipse as seen in FIGS. 6A and 6B.

When no signal is applied and the amplifier 100 is at a temperature T that satisfies $\hbar\omega_s \gg k_BT$, the input field is in its quantum mechanical ground state and experiences zero-point fluctuations. This is a direct consequence of the uncertainty principle for a quantum harmonic oscillator.

The field quadratures (which are labelled X and Y) in the ground state obey the uncertainty relation (in photon number units)

$$\delta X^2 \delta Y^2 \geq 1/16$$

That is, each quadrature has an uncertainty of ¼ of a photon. This uncertainty is imposed on all signals and represents the quantum limit to noise in a measurement. The phase-sensitive gain of the amplifier 100 can be exploited to de-amplify or "squeeze" this noise along one quadrature, at the expense of amplifying it along the other quadrature. For instance, the noise can be anti-squeezed in the X quadrature or the Y to decrease the uncertainty in the other quadrature.

This can be used to improve the signal-to-noise ratio in measurements of small microwave signals, such as in qubit readout, spin resonance spectroscopy and the search for axions.

In a Josephson junction based amplifier, squeezing levels in excess of 12 dB have so far been hindered by the presence of high-order nonlinearities. The resulting squeezed states become highly non-gaussian at large gains.

The semi-classical measurement of FIG. 6b show that a high degree of squeezing can be performed using the amplifier 100, where no visible distortion can be seen up to gains of 30 dB. This high level of squeezing is enabled, in-part, by the amplifier's weak higher order nonlinearities.

In addition to being useful in measurements, such high levels of squeezing can also be used to enable fault-tolerant quantum computing with continuous-variable cluster states. In one qubit-based error-correcting scheme, the threshold for achieve fault-tolerant measurement-based quantum computation is 20.5 dB of squeezing.

Spin Resonance Spectroscopy

The high magnetic field compatibility of the amplifier 100 also opens applications in spin resonance spectroscopy. Electron spin resonance (ESR) spectroscopy is a widely used technique in biology, medicine, chemistry and materials science. It is used to reveal the underlying structure and function of materials. In conventional ESR, typically around 1 billion electron spins are required to produce a signal above the level of the system noise at room temperature. Recent advancements have seen superconducting resonators and JPAs used to push the sensitivity of ESR spectroscopy to the quantum limit, with detection capabilities reaching the level of 10 spins.

In current quantum-limited ESR spectrometers a spin sample is coupled to high-quality-factor superconducting planar resonators and placed in a moderate magnetic field (e.g. ~0.34 T for an X-band spectrometer). The spins emit a signal into the resonator, which is then routed to a separate JPA for amplification. The JPA is extremely sensitive to magnetic fields and must be housed in multiple layers of magnetic field shielding. In addition, a microwave circulator is needed to connect the resonator to the JPA adding insertion loss that reduces the signal-to-noise ratio of the measurement.

The amplifier 100 is a (nonlinear) resonator that can be coupled to spins and placed in moderate magnetic fields (~0.34 T). The spin signals emitted in a pulsed ESR experiment can therefore be amplified within the amplifier 100 through the application of an appropriately timed pump tone, removing the need for an external JPA and any associated insertion loss between the cavity and first amplifier. In addition, since the amplifier and ESR resonator are the same device, they are matched in frequency.

Figure 7A:
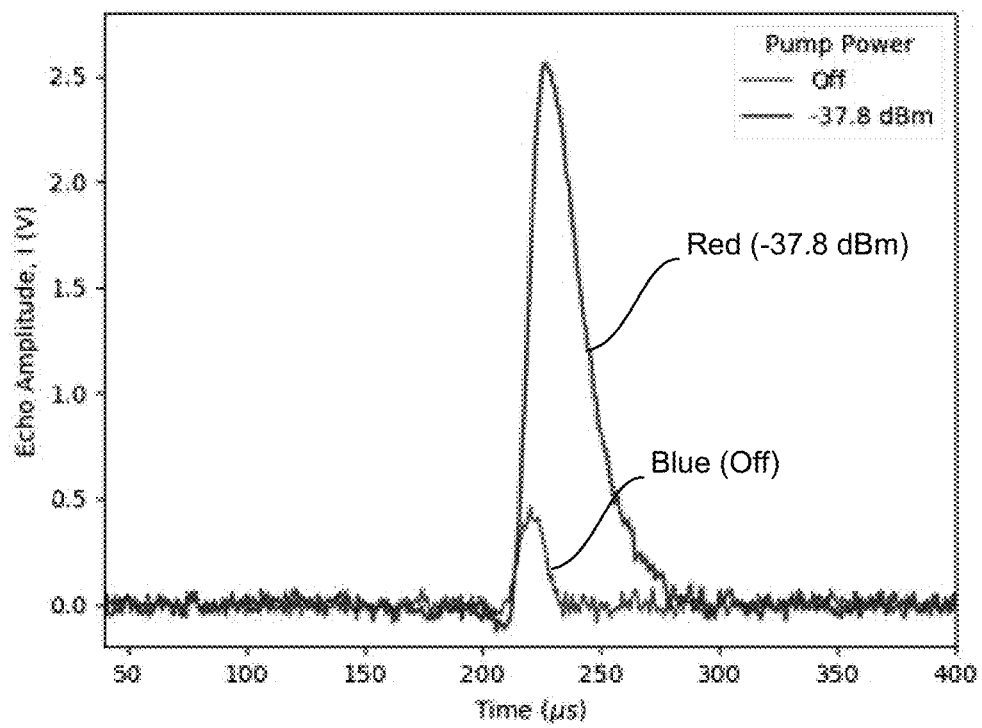
FIG. 7A shows a spin echo signal measured using the amplifier.
Figure 7B:
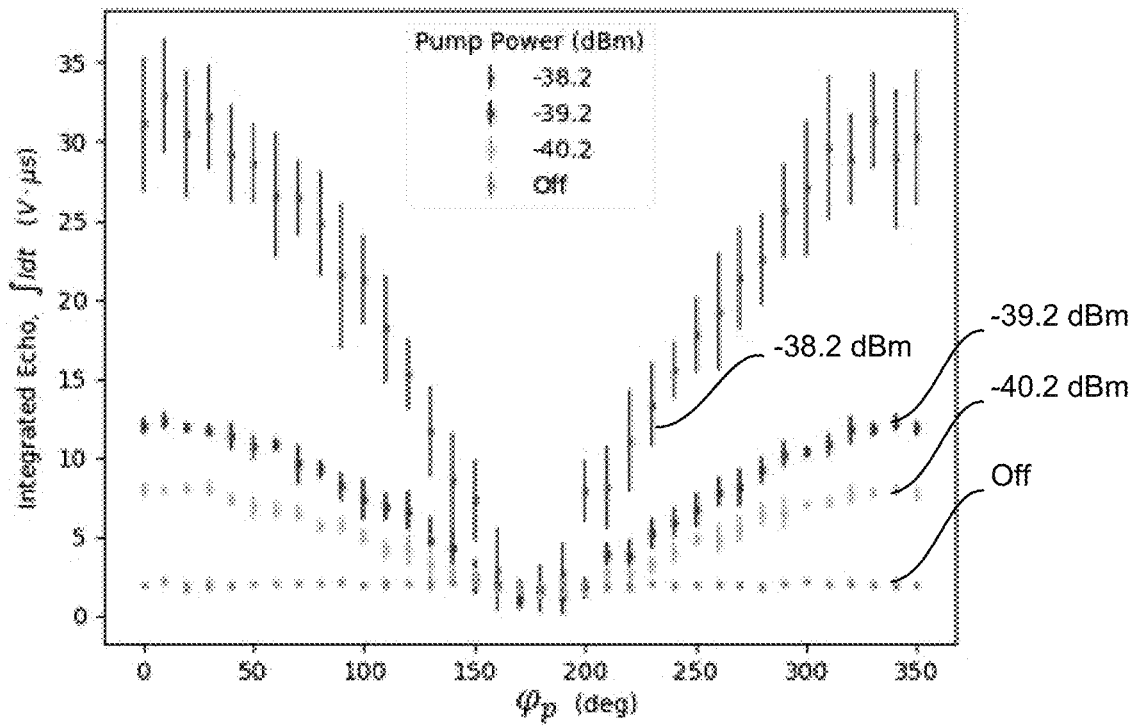
FIG. 7B shows the phase dependence of the amplified echo signal on the pump phase, for different pump powers.

FIG. 7 shows examples of the amplification of a spin echo signal within amplifier 100. In particular, FIG. 7A shows a spin echo signal measured using the amplifier 100 without amplification (blue trace) and with amplification (red trace). The amplification is performed in degenerate mode. As seen, in FIG. 7A, the echo area is enhanced considerably with amplification. FIG. 7B presents the phase dependence of the amplified echo signal on the pump phase $\varphi_p$ for different pump powers, where regions of amplification and de-amplification (relative to the pump off data in orange) are apparent.

Parametric Spin Cooling

In optomechanics, a parametric coupling between an optical cavity and a mechanical resonator can be used to perform a number of useful tasks, from frequency conversion to quantum non-demolition measurements and cooling. In particular, optomechanical cooling has been used to reduce the thermal population of mechanical resonators to bring them close to their quantum mechanical ground states, or equivalent temperatures in the micro-Kelvin range.

Figure 8:
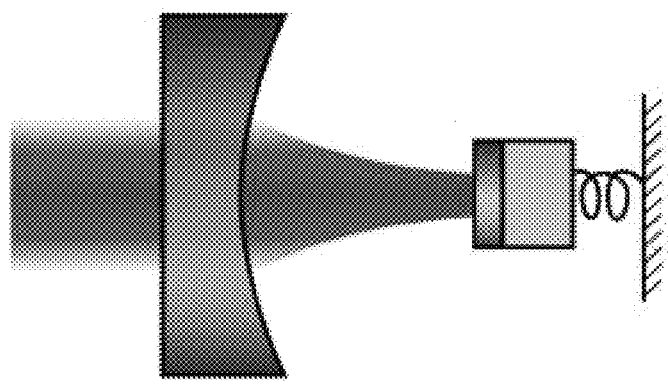
FIG. 8 illustrates an example optical cavity for introducing a parametric coupling between two modes with different resonant frequencies.

FIG. 8 illustrates a conventional optical cavity 800 for introducing parametric coupling. In particular, the optical cavity 800 includes two mirrors—mirror 802 and mirror 804. A parametric coupling can be introduced by attaching one of the mirrors (e.g., mirror 804) of the optical cavity 800 to a spring 806—this mirror 804 now acts as a mechanical resonator, with a resonance frequency determined by the attached mass and spring constant of the spring 806. As the mechanical resonator oscillates, it changes the length of the optical cavity and hence its resonance frequency. Quantum mechanically, this interaction is described by the Hamiltonian:

$$H_{int} = -\hbar g_0 \hat{a}^\dagger \hat{a}(\hat{b}+\hat{b}^\dagger)$$

Where $\hat{a}^\dagger \hat{a}$ is the photon number operator for the optical cavity and $\hat{b}+\hat{b}^\dagger$ is proportional to the displacement operator of the mechanical resonator. This type of interaction is referred to as an optomechanical coupling.

Cooling is achieved by introducing a drive to the coupled system at the difference of the cavity frequencies $\omega_d = \omega_1 - \omega_0$, with $\omega_0$ the mechanical resonance frequency and $\omega_1$ the optical frequency. Phonons in the mechanical resonator are upconverted by the drive to photons in the optical mode and vice-versa. Since the linewidth (or dissipation rate) of the mechanical mode ($\kappa_0$) is typically orders of magnitude smaller than the optical cavity ($\kappa_1$), the upconverted photons are dissipated through the optical cavity. If the effective rate of phonon removal exceeds the rate at which the mechanical mode thermalizes to its environment ($\kappa_0$), then the mechanical resonator is cooled.

The above conversion process can also be viewed as a coupling between the mechanical and optical modes, which become degenerate in a frame rotating at the drive frequency $\omega_d$. Invoking the "linearized" approximation, the interaction becomes $$H_{int} = \hbar g_0 \sqrt{n_d}(\hat{a}+\hat{a}^\dagger)(\hat{b}+\hat{b}^\dagger)$$

That is, a coupling between modes a and b with a strength $g = g_0 \sqrt{n_d}$, where $n_d$ is the number of photons in the drive.

In this application, the amplifier 100 is made from a short-circuit-terminated quarter-wavelength resonator as shown in FIG. 1. In other examples, the amplifier 100 can be formed where the ground termination is replaced by a second port. The resonator is inherently multi-mode, having resonances at frequencies $k\omega_0$ with k a positive integer. In the case of a short-circuit-terminated amplifier, k is a positive odd integer. Furthermore, the non-linear kinetic inductance produces a natural coupling between the modes—current in one mode modifies the kinetic inductance along the resonator and changes the frequency of another mode, analogous to an optomechanical coupling. Therefore the lower frequency modes can be cooled by parametrically coupling them with a drive to a higher harmonic of the resonator.

Figure 9A:
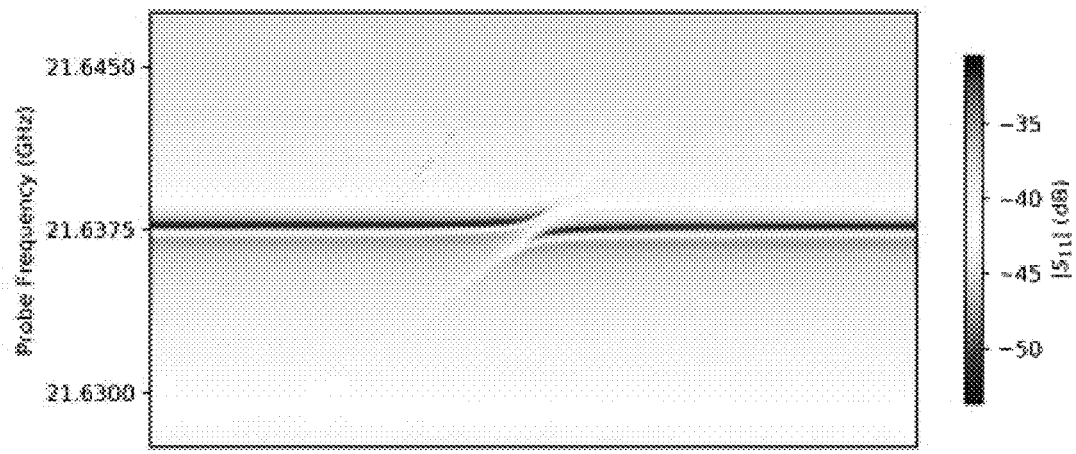
FIG. 9A shows a reflection S-parameter measurement of the amplifier, centered on its first harmonic.
Figure 9B:
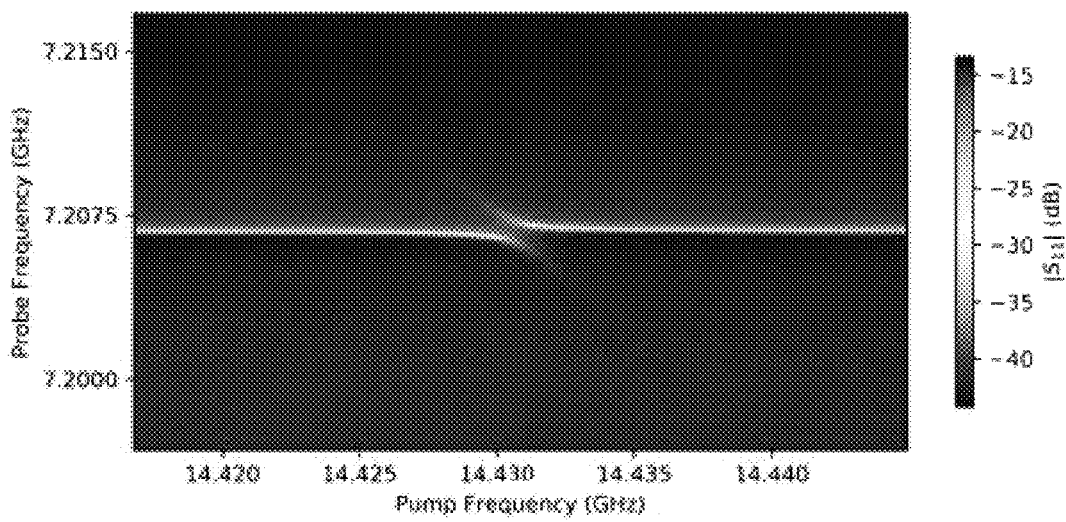
FIG. 9B shows a reflection S-parameter measurement of the amplifier centered its fundamental mode.

FIG. 9 shows the fundamental mode of an amplifier 100 (at $\omega_0/2\pi \approx 7.2$ GHz) coupled to the first harmonic (at $\omega_1/2\pi = 3\omega_0/2\pi \approx 21.6$ GHz). In particular, FIG. 9 shows an S-parameter reflection measurement of the amplifier, centered on two different modes and in the presence of a strong drive tone. FIG. 9A shows the first harmonic, whilst FIG. 9B shows the fundamental mode. The drive tone frequency is varied along the horizontal axis. When the drive frequency equals the difference of the mode frequencies a hybridization of the modes occurs (at $\omega_0/2\pi \approx 14.43$ GHz), indicating the onset of strong coupling.

The high power handling capability of the amplifier 100 means that large drive signals can be applied, even reaching the regime of strong coupling between the modes ($g > \kappa_0, \kappa_1$). In addition, by modifying the impedance along the length of the resonator (introducing dispersion), the frequencies of the harmonics can be tailored. The frequency of the first harmonic mode can be shifted so that the drive frequency that couples it with the fundamental mode is not double the fundamental frequency, i.e. $\omega_d/2\pi \neq \omega_0/\pi$. This is important, since degenerate amplification occurs in the fundamental mode when driven at $\omega_0/\pi$—a competing process that would limit the cooling efficiency. The coupling rate of a harmonic to the external port can also be selected by careful positioning of the mode frequency within its stopband, or by modifying the properties of the stopband (e.g. attenuation and bandwidth).

The amplifier 100 can therefore be used to implement an optomechanical-like interaction and cool any mode of the resonator to an effective temperature below that of the measurement system. This is a useful capability that can be exploited to lower the temperature of an ancillary system that is thermalized to the cooled mode.

Recent advancements in quantum-limited ESR spectroscopy have demonstrated that spins coupled to superconducting resonators can be made to relax via spontaneous emission of microwave photons into the resonator—the so-called Purcell effect. It was further demonstrated that in such a regime, the spins do in fact thermalize to the mode of the resonator to which they are coupled. The amplifier 100 therefore can be used to cool spins (ensembles or single) coupled to one of its modes. This would be useful in ESR spectroscopy where it provides an enhanced polarization and therefore larger signals. The amplifier can operate at high temperatures (up to ~5 K) and in magnetic fields, so this cooling process can be performed in conditions typical for X-band ESR (2 K, 0.34 T). One could also envision using the parametric cooling to initialize a large register of spin qubits in a spin-based quantum processor.

For parametric spin cooling to be efficient, a strong single spin-to-photon coupling rate $g_s$ is desirable. The rate of spin relaxation/thermalization is given by $\Gamma_p = 4g_s^2/\kappa_0$ and is made larger than other rates of energy relaxation. To increase $g_s$ a low resonator impedance enhances the mode's zero-point magnetic field fluctuations. In one approach to achieve this, the large kinetic inductance of the resonator can be compensated for by including a interdigitated capacitance to the ground plane 156.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A kinetic inductance parametric amplifier comprising:
   an input port arranged to receive a pump tone, a DC bias and input signal;
   an output port arranged to provide an amplified version of the input signal;
   a tunable stepped-impedance assembly comprising a bandstop filter arranged to attenuate and/or filter predetermined frequency bands; and
   a high kinetic inductance line;
   wherein the tunable stepped-impedance assembly is tuned at a frequency that allows for the kinetic inductance parametric amplifier to resonate at a predetermined frequency and wherein the pump tone has a frequency higher than the frequency of the input signal and the DC bias signal is transmitted to the high kinetic inductance line.

2. The kinetic inductance parametric amplifier of claim 1, wherein the tunable stepped-impedance assembly comprises a coplanar waveguide (CPW) microwave bandstop filter.

3. The kinetic inductance parametric amplifier of claim 1, wherein the high kinetic inductance line is shorted to ground.

4. The kinetic inductance parametric amplifier of claim 3, wherein the high kinetic inductance line resonates at a frequency in a stopband of the tunable stepped-impedance assembly.

5. The kinetic inductance parametric amplifier of claim 1, wherein a frequency response of the tunable stepped-impedance assembly has a continuous central line that allows for a DC current to pass through and provide three-wave mixing.

6. The kinetic inductance parametric amplifier of claim 1, wherein the high kinetic inductance line comprises NbTiN.

7. The kinetic inductance parametric amplifier of claim 1 wherein the high kinetic inductance line comprises a single layer of NbTiN.

8. A method for performing parametric amplification with a kinetic inductance parametric amplifier comprising the step of:
   providing a kinetic inductance parametric amplifier comprising: an input port arranged to receive a pump tone, a DC bias and an input signal; an output port arranged to provide an amplified version of the input signal; a tunable stepped-impedance assembly comprising a bandstop filter arranged to attenuate and/or filter predetermined frequency bands; and a high kinetic inductance line; wherein the tunable stepped-impedance assembly is tuned at a frequency that allows for the kinetic inductance parametric amplifier to resonate at a predetermined frequency and wherein the pump tone has a frequency higher than the frequency of the input signal and the DC bias signal is transmitted to the high kinetic inductance line;

applying a DC signal configured to modify the kinetic inductance and one or more filtering properties of the stepped-impedance assembly;

applying the pump tone and the input signal to the input port; and detecting the amplified version of the input signal at the output port.

9. The method of claim 8, wherein the one or more filtering properties of the tunable stepped-impedance assembly comprise bandstop frequency and attenuation value and/or quality factor.

10. A kinetic inductance parametric amplifier for performing phase-sensitive amplification, the amplifier comprising:
an input port arranged to receive a pump tone, a DC bias and input signal;
an output port arranged to provide an amplified or de-amplified version of the input signal;
a tunable stepped-impedance assembly arranged to attenuate and/or filter predetermined frequency bands; and
a high kinetic inductance line;
wherein the tunable stepped-impedance assembly is tuned at a frequency that allows for the amplifier to resonate at a predetermined frequency and wherein the pump tone has a frequency twice that of the input signal and wherein the DC biasing signal is transmitted to the high kinetic inductance line.

11. The kinetic inductance parametric amplifier of claim 10, installed on a mixing chamber plate of a dilution refrigerator.

12. The kinetic inductance parametric amplifier of claim 10, wherein the input port is connected to a pump signal generator via a diplexer and the input port is connected to a DC bias current via a bias tee.

13. The kinetic inductance parametric amplifier of claim 10, wherein the output port is connected to one or more amplification stages via one or more cryogenic circulators and the amplification stages are connected to a measurement setup.

14. The kinetic inductance parametric amplifier of claim 10, wherein the amplifier is used as a resonator in electron spin resonance (ESR) spectroscopy to amplify spin signals.

15. The kinetic inductance parametric amplifier of claim 10, used in parametric cooling of an ancillary system, wherein the kinetic inductance parametric amplifier is a short-circuit-terminated multi-mode resonator.

16. The kinetic inductance parametric amplifier of claim 10, used in parametric cooling of an ancillary system, wherein the kinetic inductance parametric amplifier is a two-port multi-mode resonator with asymmetric port coupling rates.

17. The kinetic inductance parametric amplifier of claim 15, wherein a non-linear kinetic inductance produced by the kinetic inductance parametric amplifier produces a natural coupling between modes of the multi-mode resonator such that current in one mode changes the frequency in another mode.

18. The kinetic inductance parametric amplifier of claim 16, wherein a non-linear kinetic inductance produced by the kinetic inductance parametric amplifier produces a natural coupling between modes of the multi-mode resonator such that current in one mode changes the frequency in another mode.

* * * * *